(12) United States Patent
Frantz et al.

(10) Patent No.: US 12,106,897 B2
(45) Date of Patent: Oct. 1, 2024

(54) SUPERCONDUCTING MAGNET COIL SYSTEM

(71) Applicant: Bruker BioSpin GmbH & Co. KG, Ettlingen (DE)

(72) Inventors: Wolfgang Frantz, Karlsruhe (DE); Rafael Caminada, Winkel (CH); Gerald Neuberth, Bruchsal (DE)

( * ) Notice: Subject to any disclaimer, the term of this patent is extended or adjusted under 35 U.S.C. 154(b) by 936 days.

(21) Appl. No.: 17/259,407

(22) PCT Filed: Jul. 3, 2019

(86) PCT No.: PCT/EP2019/067890
§ 371 (c)(1),
(2) Date: Jan. 11, 2021

(87) PCT Pub. No.: WO2020/011625
PCT Pub. Date: Jan. 16, 2020

(65) Prior Publication Data
US 2021/0210262 A1 Jul. 8, 2021

(30) Foreign Application Priority Data
Jul. 11, 2018 (DE) .................. 102018211511.7

(51) Int. Cl.
*H01F 6/02* (2006.01)
*G01R 33/3815* (2006.01)
(Continued)

(52) U.S. Cl.
CPC ............ *H01F 6/02* (2013.01); *G01R 33/3815* (2013.01); *H01B 12/00* (2013.01); *H01F 6/06* (2013.01)

(58) Field of Classification Search
CPC ........ H01B 12/00; H01F 6/02; G01R 33/3815
See application file for complete search history.

(56) References Cited

U.S. PATENT DOCUMENTS

| 7,649,720 | B2 | 1/2010 | Markiewicz |
| 10,128,030 | B2 | 11/2018 | Frantz et al. |

(Continued)

FOREIGN PATENT DOCUMENTS

| CN | 102751699 A | 10/2012 |
| CN | 106558869 A | 4/2017 |

(Continued)

OTHER PUBLICATIONS

Wilson, Martin, "Lecture 2: Magnetization, AC Losses and Filamentary Wires", Pulsed Superconducting Magnets' CERN Academic Training, May 2006.
(Continued)

*Primary Examiner* — Paul A Wartalowicz
(74) *Attorney, Agent, or Firm* — Benoît & Côté Inc.

(57) ABSTRACT

The invention relates to a superconducting magnet coil system comprising a first electrical mesh (M1) and a second electrical mesh (M2), which are interconnected in series with one another, wherein the first electrical mesh (M1) comprises in a first path an HTS (high temperature superconductor) coil section (A0) and, in series therewith, a first main coil section (A1) and in a second path a quench protection element (Q1), which bridges the series connection of HTS coil section (A0) and first main coil section (A1). The first main coil section (A1) comprises a conductor comprising superconducting filaments in a matrix. The second electrical mesh (M2) comprises a neighbouring main coil section (A3) comprising a conductor comprising superconducting filaments in a matrix. The neighbouring main coil section (A3) is that main coil section of an electrical mesh different from the first electrical mesh which, in a radial direction outwards, lies closest to the first main coil section (A1) of the first electrical mesh. The magnet coil system is characterized in that, in the case of a quench, the (Continued)

conductors of the main coil sections (A1, A3, A4) each generate a specific power input $(LT/2\pi)^2 * 1/\rho_M$, wherein the specific power input of the conductor of the first main coil section (A1) of the first electrical mesh (M1) is higher than the specific power input of the conductor of the neighbouring main coil section (A3) of the second electrical mesh (M2). Consequently, using HTS superconductor material, it is possible to provide a magnet coil system with which particularly high field strengths can be generated and/or which has a small structural size.

13 Claims, 3 Drawing Sheets

(51) Int. Cl.
*H01B 12/00* (2006.01)
*H01F 6/06* (2006.01)

(56) References Cited

U.S. PATENT DOCUMENTS

| | | |
|---|---|---|
| 2004/0135659 A1 | 7/2004 | Schlenga |
| 2006/0279388 A1 | 12/2006 | Tekletsadik |
| 2008/0007375 A1 | 1/2008 | Frantz |
| 2008/0084207 A1* | 4/2008 | Frantz ............... G01R 33/3815 324/307 |
| 2011/0035584 A1 | 2/2011 | Meyerstein et al. |
| 2017/0186520 A1 | 6/2017 | Frantz et al. |

FOREIGN PATENT DOCUMENTS

| | | |
|---|---|---|
| CN | 107221401 A | 9/2017 |
| DE | 102009029379 A1 | 4/2011 |
| DE | 102015122879 A1 | 6/2017 |

OTHER PUBLICATIONS

Yunus, M I et al, "A.c. loss induced quenching in multicoil adiabatic superconducting magnets", Cryogenics, Elsevier, Kidlington, GB, vol. 35, No. 2, 1995, pp. 93-100.

Takeuchi, K et al, "Interfilament coupling loss for protection of superconducting multicoil magnets", Cryogenics, Elsevier, Kidlington, GB, vol. 38, No. 4, Apr. 1998, pp. 367-376.

Osamu, Ozaki et al, "Quench Protection Method of HTS and LTS Hybrid Magnet Systems", Denki Gakkai Ronbunshi. B, Denryoku, Enerugi Bumonshi—Transactions of the Institute of Electrical Engineers OfJapan. B., vol. 121, No. 10, Jan. 1, 2001, pp. 1276-1282.

Wilson et al, "NbTi superconductors with low ac loss: A review", Aug. 2008 (Aug. 2008), vol. 48, No. 7-8, pp. 381-395.

Barzi, Emanuela et al, "Research and Development of Nb3Sn Wires and Cables for High-Field Accelerator Magnets", Apr. 2016, vol. 63, No. 2, pp. 783-803.

Maeda, Hideaki et al, "Recent Developments in High-Temperature Superconducting Magnet Technology (Review)", Oct. 31, 2013, vol. 24, No. 3, pp. 1-12.

Wilson, Martin, "Superconducting Magnets", Oxford University Press, 1983, pp. 134-231.

Poole, Charles et al. "Quench Protection Using CLIQ of MgB2 0.5 T Persistent Mode Magnet", IEEE Transactions on Applied Superconductivity, vol. 27, No. 4, Jun. 2017.

Ravaioli, E. et al. "Modeling of Interfilament Coupling Currents and Their Effect on Magnet Quench Protection", IEEE Transactions on Applied Superconductivity, vol. 27, No. 4, Jun. 2017.

Komarek, "Hochstromanwendung der Supraleitung" ["Highcurrent application of superconductivity"], Teubner Stuttgart 1995, pp. 62-67.

* cited by examiner

SUPERCONDUCTING MAGNET COIL SYSTEM

BACKGROUND OF THE INVENTION

The invention relates to a superconducting magnet coil system comprising a first electrical mesh and a second electrical mesh, which are interconnected in series with one another, wherein the first electrical mesh comprises in a first path an HTS (high temperature superconductor) coil section and, in series therewith, a first main coil section and in a second path a quench protection element, which bridges the series connection of HTS coil section and first main coil section. The first main coil section comprises a conductor comprising superconducting filaments in a matrix. The second electrical mesh comprises a neighbouring main coil section comprising a conductor comprising superconducting filaments in a matrix. The neighbouring main coil section is that main coil section which, of all the main coil sections of an electrical mesh different from the first electrical mesh, in a radial direction outwards, lies closest to the first main coil section of the first electrical mesh.

A magnet coil system of this type is known from [02]-[04].

In conventional superconducting NMR magnets, NbTi and Nb3Sn wires are usually used, which at the present time restricts the field strength to approximately 23.5 T. In order to achieve higher field strengths or to make a magnet of given field strength more compact, it is necessary to resort to alternative conductor materials. Research in this context is focussed mainly on the use of HTS tape conductors, e.g. REBCO tapes (REBCO=Rare-earth barium copper oxide). In this case, the magnet is not completely produced from HTS materials; it is advantageous for cost reasons to use HTS tape conductors only for the innermost sections and to produce a background magnet using conventional "Low Temperature Superconductor" (LTS) technology (NbTi or Nb3Sn). Usually, therefore, the innermost magnet sections are wound from HTS tape material and they are connected in series with an LTS background magnet.

In a typical quench protection circuit of e.g. NMR magnets, individual sections or regions of individual sections are connected in parallel with protection resistors and thus form an electrical mesh of a protection network. The different meshes in turn are connected in series [01]. In this way, it is possible to minimize quench duration and quench voltages. In electrical meshes in which the quench of the superconductor is triggered only belatedly, excessive current and force increases can occur, however, which possibly overload the superconductor.

"Quench" denotes the spontaneous transition of the magnet coil from the superconducting state to the normal conducting state as a result of overloading of the current-carrying superconductor. This process may be associated with high electrical voltages, currents and forces in the superconductor, which can in turn destroy the latter.

The new HTS materials place particular demands on the quench protection of a superconducting magnet, however. Usually, the quench starts locally and spontaneously and then propagates in a few seconds in the magnet. What is disadvantageous in the case of a quench is, in particular, the high critical temperature of the HTS material (zero field: YBCO>80 K in contrast to the critical temperatures of conventional LTS conductors: Nb3Sn approximately 18 K, NbTi approximately 10 K), since this high critical temperature results in belated quenching if the quench starts in the NbTi or Nb3Sn part of the background magnet. Depending on the quench protection concept, this results in an excessive current and/or force increase in the HTS section. Moreover, the slow quench propagation in the HTS material results in local overheating, which can in turn cause burnout of the HTS conductor.

[02] proposes protecting the critical section (e.g. HTS section), which likewise quenches only belatedly after the start of the quench (outside said critical section), jointly with a rapidly or early quenching coil part in a common mesh. In this case, the two coil regions (protected jointly in a mesh) are arranged electrically in succession. As a result, excessive current increases in the otherwise belatedly quenching mesh with the HTS section and hence also a quench of the HTS section can be prevented.

[03] discloses accelerating the quench (in particular in belatedly quenching superconductor regions) by means of additional heating in order to avoid excessive current increases in these coil regions. This can be done actively (quench detection and subsequent activation of a heater) or passively (quench protection resistors as active heaters that are thermally coupled to the superconductor winding).

For this purpose, the heaters are distributed in the HTS section in order to propagate the quench rapidly in the HTS section (i.e. to distribute the energy). In this case, however, there is the risk of the HTS section being destroyed by the heating. Moreover, the heater tapes reduce in the winding the volume available for magnetic field generation. The heater tapes can also adversely affect the uniformity of the radially inner HTS winding and thus the homogeneity of the magnetic field. The process of winding and wiring the large number of heater tapes is costly.

[04] proposes accommodating a heater which is active in the case of a quench in one of the two sections which are protected jointly in an electrical mesh, in order to accelerate the progress of the quench. The heater is typically designed as a protection element of a further mesh in the protection network. The heater is accommodated in that section whose superconductor has the lower critical temperature. However, a costly and complex wiring is required for this purpose. Furthermore, the requisite interventions in the winding pack of the section are associated with considerable risks.

OBJECT OF THE INVENTION

It is an object of the invention, using HTS superconductor material, to provide a magnet coil system with which particularly high field strengths can be generated and/or which has a small structural size.

DESCRIPTION OF THE INVENTION

This object is achieved according to the invention by means of a superconducting magnet coil system according to patent claim 1.

In the case of the magnet coil system according to the invention, in the case of a quench, the conductors of the main coil sections each generate a specific power input $P_{spec}=(LT/2\pi)^2 \cdot 1/\rho_M$, wherein the specific power input of the conductor of the first main coil section of the first electrical mesh is higher than the specific power input of the conductor of the neighbouring main coil section of the second electrical mesh. In this case:

LT=twist length of the conductor comprising superconducting filaments, $\rho_M$=electrical resistivity of the matrix of the conductor (in a transverse direction), in which matrix the superconducting filaments are embedded ("matrix resistivity").

The conductors of the first main coil section and of the neighbouring main coil section are thus twisted conductors, that is to say conductors whose filaments are twisted. "Twist" denotes the twisting of the superconducting filaments in the superconducting wire. "Twist length" denotes the length of the wire section within which the superconducting filaments in the superconducting wire describe a complete revolution period. In the case of a conductor having a larger twist length, the filaments are thus twisted to a lesser extent than in the case of a conductor having a smaller twist length.

In filamented superconductors, in the case of a magnetic field change (e.g. as a result of a quench), a power input (resistive heat) occurs, on account of a current flow between the filaments and via the resistive matrix in which the filaments are embedded. [5] indicates a formula for the power input (per unit volume) on account of these coupling losses or this coupling between the filaments:

$$P/V = (dB/dt)^2 * (LT/2\pi)^2 * 1/\rho_M = (dB/dt)^2 * P_{spec}$$

wherein dB/dt=change in the magnetic flux density over time e.g. in the case of a quench.

Preferably, the specific power input of the conductor of the first main coil section is higher than the specific power input of the conductor of the neighbouring main coil section at least by a factor of 1.5 (in particular by a factor of between 1.8-9).

The invention is based on the concept of generating, in the case of a quench, particularly high, inductively generated "coupling losses" which provide for a rapid quench triggering and quench propagation in the first electrical mesh, in which the HTS material is interconnected, and thus enable a rapid decrease in current in said mesh. By virtue of the use according to the invention of a conductor in the first electrical mesh having an increased specific power input with respect to the conductor of the neighbouring main coil section of the second mesh, in the case of a quench starting outside the first electrical mesh (e.g. in the second electrical mesh), it is thus possible to accelerate the quench triggering and quench propagation in the first electrical mesh, in which the HTS material is situated. This makes it possible to use HTS materials in magnet systems, in particular in NMR magnet coil systems, without an increased risk of destruction of the magnet coil system. This in turn makes it possible to achieve a reduced structural size of the magnet coil system and/or an increase in the field strength that can be generated by the magnet coil system.

Like the first electrical mesh, the second electrical mesh also comprises a first path and a second path, there being arranged in the first path the neighbouring main coil section and in a second path a further quench protection element, which bridges the neighbouring main coil section and, if appropriate, further main coil sections within the first path of the second electrical mesh. Resistors and/or diodes can be provided as quench protection elements.

The term main coil section denotes a coil section comprising a filament conductor which is arranged in a region of the magnet coil arrangement in which a magnetic field where B>6T prevails during the operation of the magnet coil system. The neighbouring main coil section preferably comprises a filament conductor composed of an LTS (low temperature superconductor) material. The HTS coil section, by contrast, comprises a tape conductor composed of HTS material.

The coil sections are generally wound on coil formers. In this case, a plurality of main coil sections can (but need not) be wound on a common coil former.

The magnet coil system has a longitudinal axis around which the coil sections are arranged coaxially. The direction indications "in a radial direction outwards", "radially outside", etc. are in relation to the longitudinal axis of a magnet coil system. In this sense a neighbouring main coil section is arranged radially outside the HTS coil section and the first main coil section (that is to say further away from the axis z than the HTS coil section and the first main coil section). The neighbouring main coil section is preferably radially adjacent to the first main coil section. However, it is possible for a second main coil section of the first mesh to be arranged radially between the first main coil section and the neighbouring main coil section. Of the main coil sections which are not part of the first mesh, the neighbouring main coil section is the one closest to the first main coil section.

In addition to the neighbouring main coil section, further main coil sections can be provided, which either are interconnected with the neighbouring main coil section in the second electrical mesh in series with one another in such a way that current flows through them in the same sense during operation, or are interconnected in further electrical meshes (but not in the first mesh).

Preferably, the first main coil section is that main coil section which, within the magnet coil system, generates the highest specific power input of all the main coil sections which comprise conductors composed of the same superconducting material as the conductor of the first main coil section.

In one particularly preferred embodiment, the first main coil section is that main coil section which generates the highest specific power input within the magnet coil system (that is to say independently of the material of the conductors of the main coil sections).

The specific power input is dependent, in particular, on the matrix resistivity and on the twist length of the conductor. One specific embodiment of the magnet coil system according to the invention provides for the electrical resistivity of the matrix of the first main coil section to be lower than the electrical resistivity of the matrix of the neighbouring main coil sections.

Preferably, the first main coil section is that main coil section which has within the magnet coil system the lowest matrix resistivity for the superconductor material used in this main coil section. The matrix resistivity of the first main coil section is thus less than the matrix resistivity of any other main coil section comprising filaments composed of the same material as the filaments of the first main coil section.

Preferably, the matrix resistivity of the first main coil section is less than the matrix resistivity of all other main coil sections of the magnet coil system.

In the case of conductors in which the filaments are embedded in a Cu matrix, the matrix resistivity can be influenced by the arrangement of the filaments [06], the Cu quality ("residual resistance") and the heat treatment after the last reshaping step ("residual resistance"). NbTi conductors have a Cu matrix whose resistivity (matrix resistivity) at the operating temperature of the magnet is dependent inter alia on the magnetic field in which the NbTi conductor is situated. Typical matrix resistivity values at an operating temperature of 4.2 K are: in a magnetic field of 9T: $\rho M=0.51$ n$\Omega$*m or at 6T: 0.38 n$\Omega$*m. If the magnet is supercooled to 2 K, NbTi can be operated in a magnetic field of max. 12T and the typical matrix resistivity is: 0.65 n$\Omega$*m. In Nb3Sn conductors produced according to the so-called bronze method, the matrix resistivity can be influenced by way of the alloy composition of the bronze matrix. This can be achieved e.g. by reducing the doping of Sn. Typical maximum admixtures of Sn in the copper bronze for superconductors reach 16% by weight. Values below 16% by weight are therefore suitable for obtaining a lower matrix resistivity. The matrix resistivity after the heat treatment of the superconductor is crucial for the operation of the Nb3Sn superconductor. In Nb3Sn superconductors produced according to the bronze method, by way of example, the matrix resistivity of the bronze (CuSn) decreases significantly as a result of the heat treatment of the superconductor since, during said heat treatment, Sn atoms diffuse from the CuSn matrix into the Nb and form the superconducting Nb3Sn there. By virtue of the bronze being depleted of Sn during this process, the electrical resistivity of the bronze or of the bronze matrix also decreases and can thus be varied in a targeted manner depending on the length of the heat treatment.

In a further preferred embodiment of the magnet coil system according to the invention, the twist length of the conductor of the first main coil section is greater than the twist length of the filaments of the neighbouring main coil section. The use of conductors comprising twisted filaments is known from the prior art in order to increase the stability of the superconducting state of the conductor (the greater the twisting, that is to say the smaller the twist length, the stabler the superconducting state of the conductor). In the case of a quench, the coupling between the filaments results in currents between the filaments and via the resistive matrix in which the superconducting filaments are embedded, and thus in the power input indicated above. The use according to the invention of larger twist lengths of the filaments in the first main coil section gives rise to particularly high, inductive "coupling losses" which provide for a rapid quench triggering and quench propagation in the first main coil section and thus enable a rapid decrease in current in the first electrical mesh. The twist of the superconducting filaments of the superconducting material of the first main coil section thus has a twist length optimized for a rapid quench propagation.

Preferably, the first main coil section is that main coil section whose filaments have the largest twist length of all the superconducting filaments incorporated in the main coil sections within the magnet coil system.

However, the twist length of the conductor of the first main coil section should not be chosen to be arbitrarily large, since, although an excessively large twist is helpful in the case of a quench during the operation of the magnet coil system, it can be harmful in other situations. In this regard, e.g. during the charging of the magnet coil system, the heat input is increased as the twist length increases, which can result in undesired quenching during the charging of the magnet. Furthermore, in the case of large twist lengths, the so-called "inherent stability" of the conductor decreases since, in the case of large twist lengths, the diameter of the overall conductor is then effective, rather than the small diameters of the individual filaments, with regard to the stabilization of the superconducting state of the conductor [5].

In one preferred embodiment, the twist length of the filaments of the first main coil section is greater than the twist length of the filaments of the neighbouring main coil sections at least by a factor of 1.5, preferably by a factor of 2. For the case where further main coil sections are present alongside the neighbouring main coil section, it is particularly advantageous if the twist length of the filaments of the first main coil section is greater than the twist length of the filaments of the main coil sections at least by a factor of 1.5, preferably by a factor of 2.

The twist length is chosen according to the invention such that the quench proceeds at a sufficiently high speed and the excessive current increases thus do not exceed limit values which could result in a critical overloading of the conductor. However, an excessively large twist length should be avoided for the reasons mentioned above. What is crucial for the choice of the twist length, therefore, is a limit value for the excessive current increase and/or the forces associated therewith, which limit value ought not to be exceeded, and a maximum tenable heat input during the charging of the magnet, which heat input ought not to be exceeded. Furthermore, when choosing the twist length, it may also be demanded that the conductor of the first main coil section ought to have a minimum inherent stability.

Preferably, the twist length of the filaments of the first main coil section is in the range of 150 mm-400 mm, in particular in the range of 200 mm-400 mm.

The superconducting material of the first main coil section preferably comprises a Bi superconductor material, in particular Bi2212 ($Bi_2Sr_2CaCu_2O_8$), or an LTS material, preferably NbTi or Nb3Sn.

The provision of an increased specific power input of the first main coil section by comparison with the neighbouring main coil section is advantageous in particular if the first main coil section comprises a conductor composed of Nb3Sn, since Nb3Sn has a critical temperature Tc that is relatively high for an LTS filament conductor, and, in the case of a quench, would concomitantly quench only relatively belatedly without the twist optimization according to the invention. Nb3Sn furthermore has a high field compatibility and can therefore be arranged within the magnet coil system radially very far inwards and thus in the high magnetic field, as a result of which the influence on the quench speed can be increased.

With NbTi, in turn, it is possible to realize both high twist lengths and low matrix resistivities. Furthermore, the matrix resistivity of NbTi superconductors can easily be influenced, such that a desired specific power input can easily be realized.

In one specific embodiment, the conductor of the first main coil section is a reinforced Nb3Sn conductor. By comparison with a non-reinforced Nb3Sn conductor, a reinforced Nb3Sn conductor has a higher durability to withstand the radially outwardly directed forces linked with an excessive current increase.

A further specific embodiment of the magnet coil system according to the invention provides for the first electrical mesh to comprise a second main coil section comprising a conductor comprising superconducting filaments in a matrix, the specific power input of which conductor is at most equal in magnitude to the specific power input of the conductor of the first main coil section, preferably less than the specific power input of the conductor of the first main coil section. The superconducting material of the second main coil section can comprise a Bi superconductor material, in particular Bi2212, or an LTS material, preferably NbTi or Nb3Sn.

The three coil sections of the first electrical mesh can each have different critical magnetic fields and critical temperatures. By way of example, Nb3Sn could be used as superconducting material of the second main coil section and NbTi could be used as superconducting material of the first main coil section (that is to say as the main coil section having an increased specific power input). This is particularly advantageous since NbTi with its low critical temperature would concomitantly quench relatively early and rapidly reduce the current in the first electrical mesh.

The first and second main coil sections can be wound on a common coil former. This can be realized particularly simply if the first and second main coil sections contain conductors composed of the same superconducting material. The conductors then differ in terms of the matrix resistivity and/or the twist length.

The first main coil section can be arranged radially further outwards than the second main coil section. In order to reduce the risks associated with an excessively large twist length, the conductor of the first main coil section having a larger twist length can be used in regions in which the conductor capacity utilization is smaller and (e.g.) the additional heat input during charging thus takes effect to a lesser extent. The second main coil section can thus serve to achieve a larger radial distance between the HTS coil section and the NbTi main coil section.

The HTS coil section and the first main coil section can be wound on a common coil former. This makes the common interconnection of the two coil sections within an electrical mesh particularly simple. By way of example, the combination of HTS (radially inwards) for the HTS coil section and NbTi (radially further out) for the first main coil section would be appropriate here. The LTS conductor of the first main coil section, wound onto the HTS material, could also consist of Nb3Sn material if this Nb3Sn material acquires its reaction annealing before winding in the so-called React & Wind method. If HTS material (radially inwards) and NbTi material (radially further out) are wound in a common section, the NbTi conductor can be dimensioned such that it acts as a corset, that is to say as a mechanical binding, in order to counteract the forces directed radially outwards in the HTS conductor ("hoop stress") and thus to stabilize the HTS conductor.

As an alternative thereto, the HTS coil section and the first main coil section can be arranged in a spatially separated manner, that is to say on different coil formers, in order e.g. to be able to heat the first main coil section independently of the HTS coil section in the case of a quench, if desired.

Preferably, the HTS coil section is the innermost coil section of the magnet coil arrangement.

If the HTS coil section and the first main coil section are radially adjacent in the spatial arrangement, the interconnection within the common first electrical mesh is possible particularly simply since the outlay in terms of design and production engineering is particularly low in this case. Therefore, the HTS coil section and the first main coil section then radially directly succeed one another in the spatial arrangement. For this embodiment, Nb3Sn is particularly well suited as superconducting material for the first main coil section owing to its high field compatibility.

Preferably, the magnet coil system according to the invention is a superconducting NMR magnet coil system.

Further advantages of the invention are evident from the description and the drawings. Likewise, the features mentioned above and those explained even further can be used according to the invention in each case individually by themselves or as a plurality in any desired combinations. The embodiments shown and described should not be understood as an exhaustive enumeration, but rather are of exemplary character for outlining the invention.

DETAILED DESCRIPTION OF THE INVENTION AND DRAWING

FIGS. 1-5 show various embodiments of the magnet coil system according to the invention comprising a protection network in which a plurality of electrical meshes M1, M2, M3 comprising coil sections are interconnected in series. The illustration shows the electrical interconnection of the various meshes M1, M2, M3 and the coil sections thereof and also the spatial arrangement of the various coil sections, or of the coil formers on which the coil sections are wound, with respect to one another and with respect to an indicated axis z of the magnet coil system within a half-plane which includes the axis z.

The first mesh M1 of the embodiments shown in each case comprises an HTS coil section A0 comprising a conductor composed of HTS tape conductor and a first main coil section A1, A1' comprising a filament conductor. The HTS coil section A0 and the first main coil section A1, A1' are interconnected in series with one another within the first electrical mesh in such a way that current flows through them in the same sense during operation and they are jointly bridged/protected by a first quench protection element Q1. The first main coil section A1, A1' contains a conductor composed of a superconducting material which concomitantly quenches rapidly in the case of a quench starting in an arbitrary mesh of the magnet coil system. Preferably, for the first main coil section A1, a conductor is selected which is composed of a material which has a critical temperature that is lower than the critical temperature of the HTS coil section A0, typically Nb3Sn or NbTi. The superconductor material of the first main coil section A1 has a significantly higher quench propagation speed in comparison with the HTS tape conductor composed of REBCO material (RE=rare earth). Typical critical temperatures of the different superconductor materials in the zero field (B=0 T) are: NbTi approximately 10 K, Nb3Sn approximately 18 K, typical HTS tape conductors>80 K, [05]).

A neighbouring main coil section A3 of the second electrical mesh M2 is arranged radially outside the first main coil section A1, A1' (that is to say further away from the axis z in a radial direction r). The neighbouring main coil section A3 is that main coil section of a mesh M2, this mesh not being the first mesh M1 (that is to say no HTS coil section A0 is present in this mesh), which is arranged radially the closest to the first main coil section A1 and is thus situated in a magnetic field of comparable magnitude. Further main coil sections A4 can be present radially outside the neighbouring main coil section A3. FIGS. 1-5 each illustrate one further main coil section A4 by way of example.

In order additionally to accelerate the quench propagation, according to the invention, for the first main coil section A1, A1', a conductor is used which has a larger specific power input than the conductor of the neighbouring main coil section A3. The main coil sections having an increased power input (first main coil sections A1, A1') are provided with crosshatching in the figures. As a result of the increased power input, in the case of the quench as described above, particularly high, inductively generated "coupling losses" arise and provide for a rapid quench triggering and quench propagation within the conductor of the first main coil section A1. A rapid decrease in current in the first mesh M1, in which the HTS coil section A0 is situated, is made possible in this way. The desired specific power input can be adapted by way of the matrix resistivity or the twist length of the conductor of the first main coil section A1.

Figure 1:
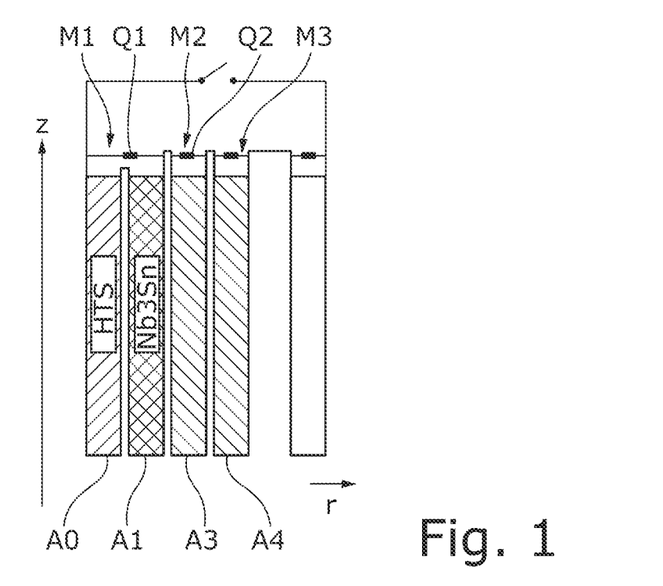
FIG. 1 shows a schematic illustration of a magnet coil system according to the invention comprising a first main coil section comprising an Nb3Sn conductor.

In the case of the embodiment of the magnet system according to the invention as shown in FIG. 1, the first main coil section A1 interconnected together with the HTS coil section A0 in the first mesh M1 comprises a filament conductor (not shown) composed of Nb3Sn. The HTS coil section A0 and the first main coil section A1 are wound on separate coil formers. Winding different coil sections on different coil formers is advantageous particularly if the conductor materials have to be subjected to different production processes, e.g. a specific heat treatment, after winding.

Figure 2:
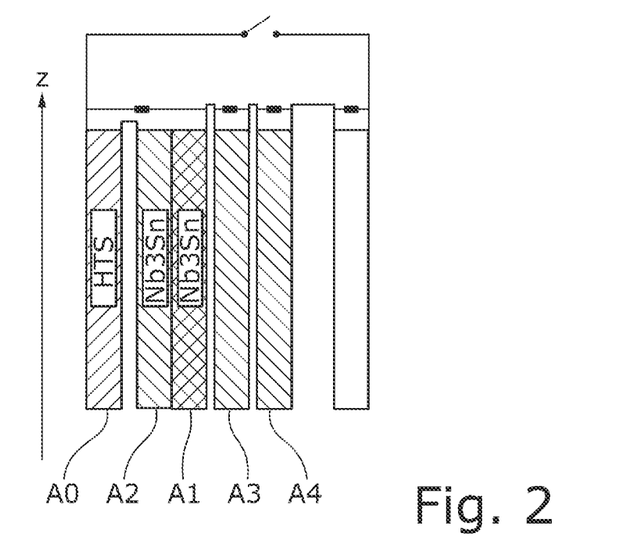
FIG. 2 shows a schematic illustration of a magnet coil system according to the invention comprising a first main coil section comprising an Nb3Sn conductor wound with a second main coil section on a common coil former.

The first main coil section A1 with its increased specific power input by comparison with the main coil sections of the other meshes M2, M3 primarily serves, in the case of a quench, to accelerate the quench in the first mesh M1. It is therefore not necessary for the first main coil section A1 to contribute significantly to the magnetic field. The first main coil section A1 can therefore comprise only a small number of turns, which can be wound together with the turns of a second main coil section A2 on a common coil former. In this case, the second main coil section can have a power input comparable to that of the main coil sections A3, A4 of other meshes M2, M3. Such an embodiment is shown in FIG. 2. Here the second main coil section A2 and the first main coil section A1 are produced from the same superconductor material (Nb3Sn) and wound on a common coil former, the two main coil sections A1, A2 differing in their specific power input. By way of example, Nb3Sn conductors having different twist lengths can be used. In the present example, the conductor of the first main coil section A1 is wound directly on the turns of the second main coil section (radially outside the second main coil section) and is therefore situated in a region of the first electrical mesh M1 which exhibits less capacity utilization than the second main coil section A2 (that is to say in a region in which the magnetic field is lower than in other regions of the first mesh M1). This is advantageous particularly if a conductor having a large twist length is used for realizing the increased specific power input according to the invention by comparison with the conductors of main coil sections A3, A4 of the other meshes M2, M3, since the disadvantages (increased heat input during charging) associated with a larger twist length are then of lesser consequence.

Figure 3:
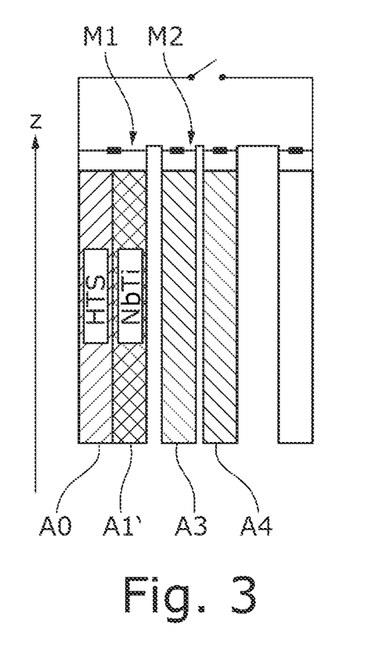
FIG. 3 shows a schematic illustration of a magnet coil system according to the invention comprising a first main coil section comprising an NbTi conductor wound with the HTS coil section on a common coil former.

If a conductor composed of NbTi is chosen for the first main coil section A1, it is possible to wind the first main coil section A1 and the HTS coil section A0 on a common coil former, as shown in FIG. 3.

Figure 4:
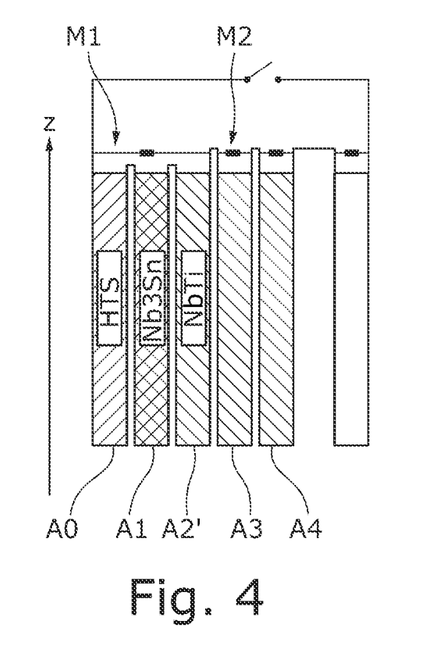
FIG. 4 shows a schematic illustration of a magnet coil system according to the invention comprising a first main coil section comprising an Nb3Sn conductor and a second main coil section comprising an NbTi conductor.

FIG. 4 shows an embodiment in which the first mesh M1 has three coil sections A0, A1, A2' composed of different materials, which are wound on separate coil formers. Alongside the HTS coil section A0 and the first main coil section A1 comprising an Nb3Sn conductor, a second main coil section A2' comprising an NbTi conductor is arranged radially outside the first main coil section A1. As a result of the increased specific power input of the first main coil section A1 (e.g. as a result of an increased twist length in comparison with the main coil sections A3, A4 of the other meshes M2, M3), on the one hand, and the low critical temperature of the NbTi conductor material of the second main coil section A2, on the other hand, in the case of a quench, a particularly rapid quench triggering in the first mesh M1 is achieved. In this case, the neighbouring main coil section A3 does not directly adjoin the first main coil section A1, since the second main coil section A2' of the first mesh is arranged between the first main coil section A1 and the neighbouring main coil section A3.

Figure 5:
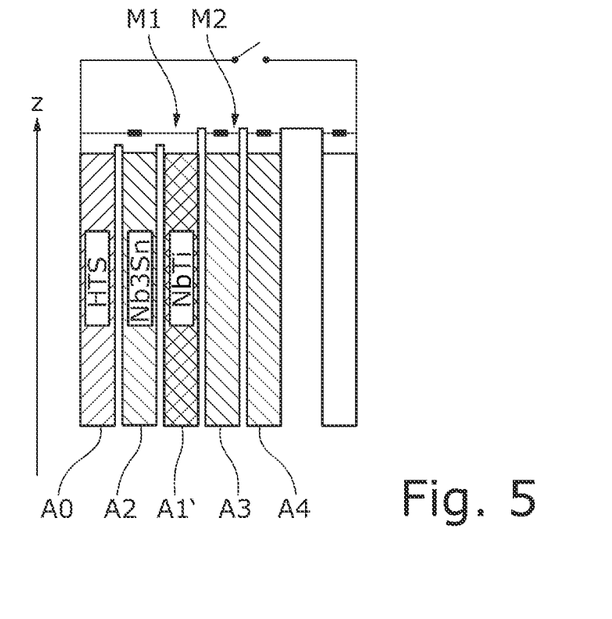
FIG. 5 shows a schematic illustration of a magnet coil system according to the invention comprising a first main coil section comprising an NbTi conductor and a second main coil section comprising an Nb3Sn conductor.

FIG. 5 shows a similar embodiment, in which likewise three coil sections A0, A1', A2 composed of different materials are interconnected in the first mesh M1. In contrast to the embodiment shown in FIG. 4, however, the main coil section composed of NbTi is the first main coil section A1' and the main coil section composed of Nb3Sn is the second main coil section A2. The Nb3Sn main coil section here does not serve for quench acceleration, but rather merely as a "spacer" in order to position the NbTi main coil section in a weaker magnetic field.

Figure 6:
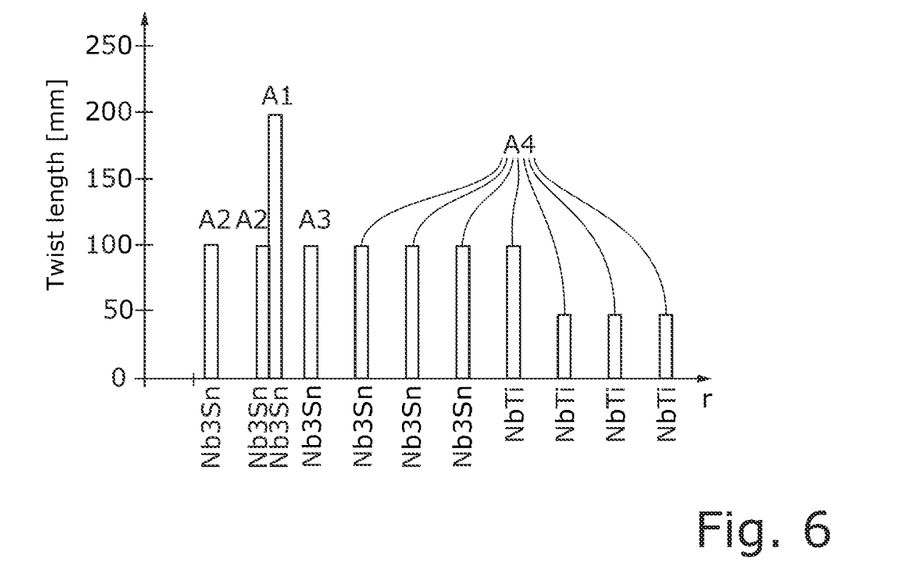
FIG. 6 shows a bar chart in which the twist lengths of coil sections of a magnet coil system according to the invention are plotted in radial order.

FIG. 6 shows a bar chart in which the typical twist lengths of coil sections of a magnet coil system according to the invention are plotted in radial succession. In the case of the magnet coil system taken as a basis for the diagram from FIG. 6, the first main coil section A1 is wound together with a second main coil section A2 on a common coil former. Furthermore, an additional second main coil section A2 is provided radially between the HTS coil section A1 and the coil former having the first main coil section A1. The first main coil section A1 and the second main coil sections A2 each comprise conductors composed of Nb3Sn. In the present case, the neighbouring main coil section A3 also has an Nb3Sn conductor. In the present example, the twist lengths of the second main coil sections A2, of the neighbouring main coil section A3 and of the radially inner further main coil sections A4 are equal in magnitude. However, this is not absolutely necessary. All that is crucial is that the twist length of the first main coil section A1 is greater than the twist length of the neighbouring main coil section A3. In the present case, the twist length of the first main coil section A1 is even greater than that of all the other main coil sections.

Figure 7:
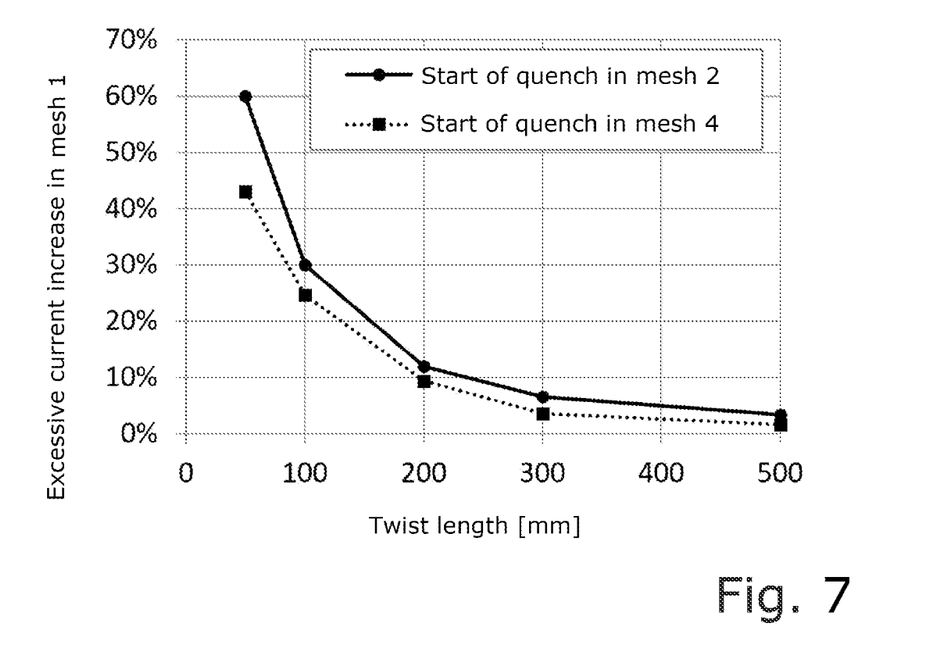
FIG. 7 shows a diagram in which the excessive current increase within the first mesh in the case of a quench starting in a different mesh is plotted as a function of the twist length of the conductor of the first main coil section.

FIG. 7 shows, for a magnet coil system realized according to the invention, a simulated relationship between excessive current increase in the first electrical mesh M1 and the twist length which was chosen for the conductor of the first main coil section A1. The protection network taken as a basis for the simulation comprises seven electrical meshes. The first mesh contains the HTS coil section and an Nb3Sn main coil section as first main coil section A1. The twist length is varied for the latter. For the simulation, the quenches were started by way of example in the second and fourth meshes, respectively. Conductors having twist lengths of 100-200 mm are usually used for main coil sections in magnet coil systems known from the prior art. The diagram from FIG. 7 clearly shows that with larger twist lengths, in particular twist lengths above 200 mm, it is possible to achieve significantly smaller excessive current increases in the first mesh.

The concept of the invention, therefore, is to jointly protect the critical (on account of belatedly and slowly quenching) HTS coil section within the magnet coil system with a rapidly quenching main coil section which is preferably spatially directly adjacent (radially succeeding) in the protection network mesh (first mesh). This can be achieved with a low outlay in terms of design. In order additionally to accelerate the concomitant quenching of the first main coil section in the main mesh, for the first main coil section a conductor is used which has a reduced matrix resistivity and/or an increased twist length (by comparison with other main coil sections of other meshes), which provides for a rapid initiation of a quench if the quench starts in a mesh different from the first mesh.

LIST OF REFERENCE SIGNS

A0 HTS coil section
A1 First main coil section comprising Nb3Sn conductor
A1' First main coil section comprising NbTi conductor
A2 Second main coil section comprising Nb3Sn conductor
A2' Second main coil section comprising NbTi conductor
A3 Neighbouring main coil section
A4 Further main coil section
M1 First electrical mesh comprising the HTS coil section and the first main coil section
M2 Second electrical mesh comprising the neighbouring main coil section and, if appropriate, further main coil sections
M3 Further electrical mesh comprising further main coil sections
Q1 Quench protection element of the first mesh
Q2 Quench protection element of the second mesh

LITERATURE LIST

[01] Martin N. Wilson "Superconducting Magnets" Oxford Science Publications, 1989, page 226 et seq.
[02] DE 10 2009 029 379
[03] U.S. Pat. No. 7,649,720-B2
[04] US 2017/0186520 A1
[05] Peter Komarek "Hochstromanwendung der Supraleitung" ["High-current application of superconductivity"] Teubner Stuttgart 1995
[06] Martin Wilson "Lecture 2: Magnetization, AC Losses and Filamentary Wires" Pulsed Superconducting Magnets' CERN Academic Training May 2006 https://indico.cern.ch/event/429134/attachments/923303/1306387/CERN_0 6_lect_2.pdf

The invention claimed is:

1. A superconducting magnet coil system having a plurality of electrical meshes interconnected in series, the system comprising:
a first electrical mesh having, in a first path, an HTS coil section and, in a series connection therewith, a first main coil section with a conductor comprising superconducting filaments in a matrix, and having, in a second path, a quench protection element which bridges the series connection of the HTS coil section and the first main coil section; and
a second electrical mesh interconnected in series with the first electrical mesh and comprising a neighbouring main coil section with a conductor including superconducting filaments in a matrix, wherein the neighbouring main coil section is, in a radial direction outward from a longitudinal axis of the magnet coil system, in closer proximity to the first main coil section of the first electrical mesh, than any main coil section of any other electrical mesh of the magnet coil system, wherein the conductors of the first and neighbouring main coil sections each comprise a plurality of filaments twisted together and, in case of a quench, are each configured to generate a specific power input $(LT/2\pi)^2 * 1/\rho_M$, where LT=is a twist length corresponding to a conductor length over which conductor filaments make a complete revolution around one another, and $\rho_M$=is an electrical resistivity, in a transverse direction, of a conductor matrix in which the superconducting filaments are embedded, and wherein a specific power input of the conductor of the first main coil section is higher than a specific power input of the conductor of the neighbouring main coil section.

2. A superconducting magnet coil system according to claim 1, wherein the first main coil section comprises conductors of a first superconducting material and generates a higher specific power input than any other main coil section of the system that comprises conductors of the first superconducting material.

3. A superconducting magnet coil system according to claim 1, wherein the first main coil section generates the highest specific power input of all the main coil sections of the magnet coil system.

4. A superconducting magnet coil system according to claim 1, wherein the electrical resistivity of the matrix of the first main coil section is lower than the electrical resistivity of the matrix of the neighbouring main coil sections.

5. A superconducting magnet coil system according to claim 1, wherein the twist length of the conductor of the first main coil section is greater than the twist length of the filaments conductor of the neighbouring main coil section.

6. A superconducting magnet coil system according to claim 1, wherein the twist length of the conductor of the first main coil section is greater than the twist length of the conductor of the neighbouring main coil sections by a factor of at least 1.5.

7. A superconducting magnet coil system according to claim 1, wherein the twist length of the conductor of the first main coil section is from 150 mm-400 mm.

8. A superconducting magnet coil system according to claim 1, wherein a superconducting material of the first main coil section comprises a Bi superconductor material or an LTS material.

9. A superconducting magnet coil system according to claim 1, wherein the conductor of the first main coil section is a reinforced Nb3Sn conductor.

10. A superconducting magnet coil system according to claim 1, wherein the first electrical mesh comprises a second main coil section with a conductor comprising superconducting filaments in a matrix, a specific power input of the second main coil section conductor being, at most, equal in magnitude to the specific power input of the conductor of the first main coil section.

11. A superconducting magnet coil system according to claim 10, wherein the first main coil section is arranged radially further out than the second main coil section.

12. A superconducting magnet coil system according to claim 1, wherein the HTS coil section and the first main coil section are radially adjacent to each other.

13. A superconducting magnet coil system according to claim 1, wherein the superconducting magnet coil system is a superconducting NMR magnet coil system.

* * * * *